(12) United States Patent
Mihalache et al.

(10) Patent No.: US 8,495,539 B1
(45) Date of Patent: Jul. 23, 2013

(54) SCHEDULING PROCESSES IN SIMULATION OF A CIRCUIT DESIGN

(75) Inventors: Valeria Mihalache, Santa Clara, CA (US); Kumar Deepak, San Jose, CA (US); Hem C. Neema, San Jose, CA (US); Sonal Santan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/347,301

(22) Filed: Jan. 10, 2012

(51) Int. Cl.
*G06F 17/50* (2006.01)
(52) U.S. Cl.
USPC .......................................... 716/110
(58) Field of Classification Search
USPC ................................ 716/100, 110
See application file for complete search history.

(56) References Cited

U.S. PATENT DOCUMENTS

| | | | |
|---|---|---|---|
| 6,456,961 B1 * | 9/2002 | Patil et al. | 703/14 |
| 8,255,191 B1 * | 8/2012 | Kolpekwar et al. | 703/2 |
| 8,418,095 B1 * | 4/2013 | Neema et al. | 716/103 |

* cited by examiner

*Primary Examiner* — Suchin Parihar
(74) *Attorney, Agent, or Firm* — LeRoy D. Maunu

(57) ABSTRACT

A method for compiling an HDL specification for simulation includes elaborating the HDL specification and determining singly-driven and multiply-driven nets of the elaborated circuit design. For each singly-driven net, a respective memory location is assigned to store a value of a corresponding driver of the net at runtime. For each multiply-driven net, a contiguous block of memory is assigned to store values of corresponding drivers of the net at runtime. For mixed language designs, this contiguous block contains values for drivers from all HDL languages involved. Simulation code that models the circuit design is generated. For each singly-driven net, the simulation code is configured to store a value of the corresponding driver of the singly-driven net in the respective memory location. For each multiply-driven net, the simulation code is configured to store the values of the corresponding drivers in the assigned block of memory. The generated simulation code is stored.

19 Claims, 5 Drawing Sheets

SCHEDULING PROCESSES IN SIMULATION OF A CIRCUIT DESIGN

FIELD OF THE INVENTION

One or more embodiments generally relate to the simulation of circuit designs.

BACKGROUND

Due to advancements in processing technology, complex integrated circuits (ICs) can be designed at various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system, the behavior describing the generation and propagation of signals through modules of combinatorial logic from one set of registers to another set of registers. HDLs provide a rich set of constructs to describe the functionality of a module. Modules may be combined and augmented to form even higher-level modules.

Prior to implementation, an HDL-based design can be simulated to determine whether the design will function as required. Wasted manufacturing costs due to faulty design may thereby be avoided. Numerous tools are available for simulating circuit designs including, for example, high-level modeling systems (HLMS) and HDL simulators.

Simulation of an HDL-based design comprises a compilation phase and a runtime simulation phase. In the compilation phase, HDL source code is input, analyzed, and elaborated to generate executable simulation code. In the runtime simulation phase, the code generated in the compilation phase is executed by a simulation engine to simulate the design.

From a user perspective, HDL simulators work by compiling the HDL-based design once, and then executing the compiled design many times during the runtime phase. Therefore, the runtime performance of HDL simulators is of critical importance, and may be more important than compile time performance.

An HDL-based design is a hierarchy of modules, whose behavior is described by means of HDL processes. When the HDL-based design is written in the VHDL language, an HDL process corresponds to either a VHDL process, a concurrent signal assignment, or a concurrent assertion. When the HDL-based design is written in the Verilog language, an HDL process corresponds to either a Verilog always block, an initial block, an assign statement, or a gate. Procedure calls may or may not be regarded as HDL processes. From a hardware perspective, the HDL processes represent hardware that responds to changes in inputs. For example, a change to an output of one circuit may trigger responses in multiple circuits having inputs coupled to the output.

HDL simulators schedule execution of HDL statements such that global variables or signals input to the HDL statements are properly updated and race conditions between concurrent HDL statements are avoided. Simulation of HDL processes is performed over a number of simulation cycles. Each simulation cycle begins with updates to values of nets. Each net, which may be a VHDL signal or a Verilog net, represents values transmitted in a wire of a circuit design. For ease of reference, VHDL signals and Verilog nets may be referred to as either signals or nets, and such terms are used interchangably herein. Each update to a net may trigger a number of processes which model how a hardware implementation of the design would respond. Processes dependent on the updated nets are scheduled and executed in a delta cycle.

Depending on the circuit design, a net may be changed or updated by the output of multiple processes. Each process output that may affect a net is referred to as a driver. If a process has several statements assigning values to the same net, only one driver for the net is created per process. The value of the driver is computed from all the values assigned to that signals in the process, according to predefined language rules. A net that has at most one driver for each bit is said to be singly-driven. A net that has several drivers on the same set of bits is said to be multiply-driven.

When a net is driven by multiple drivers, a value of the net is determined when nets are updated at runtime using a resolution function. The value computed by the resolution function is referred to as the resolved value, and the resolved value will be assigned as the new value of the net. The process of computing the new value from the driver values of a net is called driver resolution. The resolution function can be standard, defined by the HDL language itself or, for VHDL, can be user defined.

Previous methods for simulation of HDL circuit designs compile the designs and generate simulation code on a module-by-module basis, with no regard to inter-module signal dependencies. Rather, dependancies between drivers, nets, and processes are determined dynamically at runtime. As a result, it is not determined whether a net is multiply-driven or singly-driven until runtime. Accordingly, the simulation code generated by the previous methods at compile time must be general enough to be capable of handling either singly-driven or multiply-driven nets. Large data structures of pointers are created to store the values of drivers and nets, as well as determined dependencies between the two. These data structures require a significant amount of memory to store data values and pointers between the data structures.

The data structures are either general enough to handle multiply-driven scenarios even for the singly-driven nets, or are dynamically created at runtime. Because multiply-driven nets require more complex data structures, the general data structures are computationally inefficient for singly-driven nets. Furthermore, when data structures are dynamically created, memory to store the values of drivers and signals is allocated at runtime. Due to the dynamic allocation of memory, driver values that are needed to resolve the value of a net at runtime may be stored in separate locations of memory. As a result, the resolution function may have to separately access a large number of different locations of memory to retrieve all the driver values that are needed to resolve the value of a net. Due to the large number of nets and drivers used in a typical simulation of an HDL circuit design, these separate memory accesses by the resolution function can significantly impact simulation runtime.

One or more embodiments may address one or more of the above issues.

SUMMARY

In one embodiment, a method for compiling a hardware description language (HDL) specification for simulation is provided. The circuit design is elaborated from the HDL specification and singly-driven and multiply-driven nets of the elaborated circuit design are determined. For each singly-driven net, a respective memory location is assigned to store a value of a corresponding driver of the net at runtime. For each multiply-driven net, a contiguous block of memory is assigned to store values of corresponding drivers of the net at runtime. Simulation code that models the circuit design is generated. For each singly-driven net, the simulation code is configured to store a value of the corresponding driver of the singly-driven net in the respective memory location. For each multiply-driven net, the simulation code is configured to store the values of the corresponding drivers in the assigned block of memory. The generated simulation code is stored in a computer readable medium.

In another embodiment, a method is provided for simulating a circuit design using a compiled HDL specification of the circuit design. The compiled HDL specification indicates a respective block of memory assigned to each net of the circuit design. In each simulation cycle, a set of scheduled processes of the compiled HDL specification are executed. Net values are resolved and updated using the respective blocks of memory, which store values of drivers of the nets. In response to resolving a value of a net, processes of the compiled HDL specification that are dependent on the net for execution in the next simulation cycle are scheduled.

In yet another embodiment, an article of manufacture is provided. The article is characterized by a non-transitory electronically readable storage medium storing instructions that, when loaded into a processor, causes the processor to receive and compile a HDL specification for simulation of a circuit design. As part of the compilation process, the processor elaborates the circuit design from the HDL specification and determines singly-driven and multiply-driven nets of the elaborated circuit design. For each singly-driven net, a respective memory location is assigned to store a value of a corresponding driver of the net at runtime. For each multiply-driven net, a contiguous block of memory is assigned to store values of corresponding drivers of the net at runtime. Simulation code is generated by the processor that models the circuit design. The simulation code is configured to store values of drivers of singly driven nets, at runtime, in the respective memory location and store values of drivers of each multiply-driven net, at runtime, in the assigned block of memory.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

One or more embodiments provide a method of HDL simulation that determines driver, net, and process dependencies for the entire circuit design during compilation. Singly-driven and multiply-driven nets are identified during compilation. Simulation code and data structures are generated for each net, based on whether each net is singly-driven or multiply-driven. As a result, less complex code and data structures may be generated for singly-driven nets. In this manner, computation and memory resources required at simulation runtime are reduced. The additional compilation time imposed by this approach is offset by gains in runtime performance since HDL-based designs are typically simulated many times following compilation. The envisioned embodiments are applicable to circuit designs written in VHDL, Verilog, or a combination of VHDL and Verilog.

Figure 1:
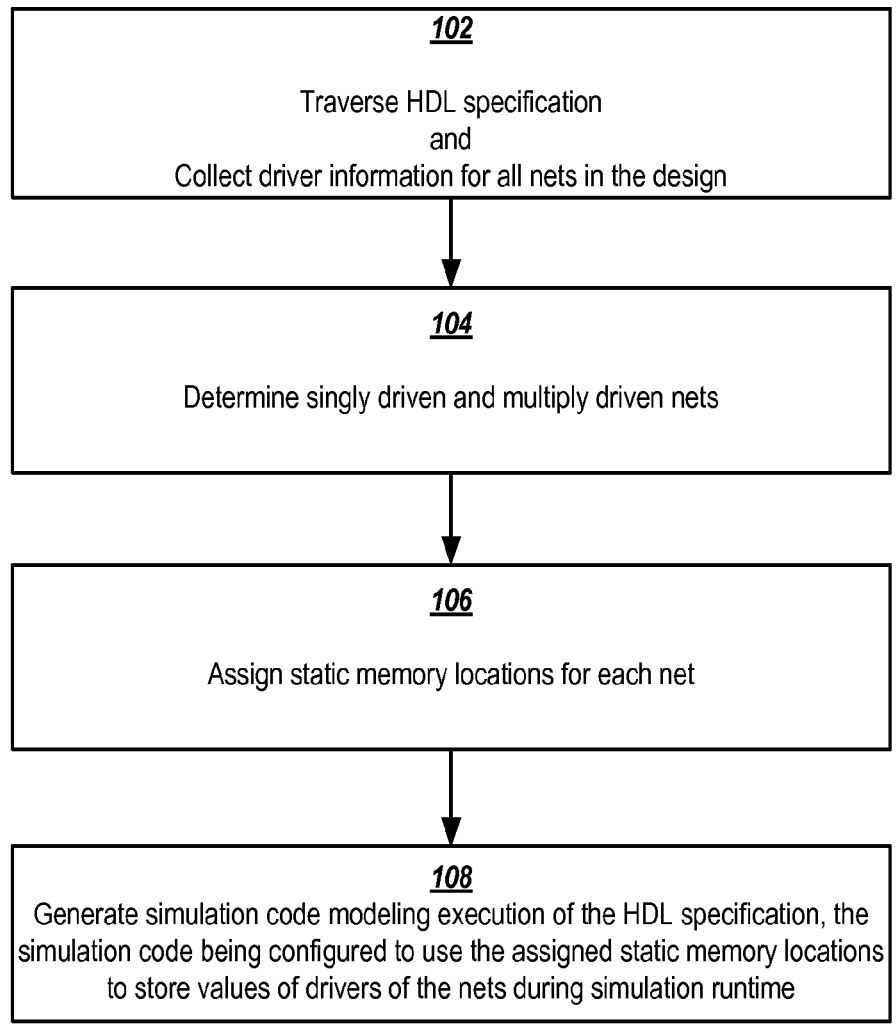
FIG. 1 shows a flowchart of a process for compiling an HDL specification in accordance with one or more embodiments.

FIG. 1 shows a flowchart of a process for compiling an HDL specification in accordance with one or more embodiments. An HDL circuit design specification is traversed at block 102 and driver information is collected for all nets of the design. If the circuit design is a mixed language design (e.g., described using a combination of VHDL and Verilog), driver information is collected for both VHDL and Verilog modules. For each net, the process determines whether the net is singly-driven or multiply-driven at block 104. At block 106, a data structure is created for each net and a block of memory is statically allocated for the data structure at block 106. The allocation of the block of memory is static in that the address of the block of memory is fixed and does not change at runtime. This static assignment during compilation allows values of all drivers of a signal to be stored in a compact location and quickly accessed for resolution during runtime as discussed in more detail below.

Simulation code that models execution of the HDL specification is generated at block 108. The simulation code is generated to handle singly-driven and multiply-driven nets. For both singly-driven and multiply-driven nets, the simulation code is configured to use the static memory locations, which were allocated at block 106, to store values of drives of the nets at simulation runtime.

Different drivers may drive different bits of a net. For instance, Example 1 shows a VHDL code segment having two drivers D1 and D2 for a VHDL signal S:

entity e is
    end e;
    architecture a of e is
       signal S: std_logic_vector(0 to 7);
    begin
      process
      begin
         S(3 to 4)<="11"; - - - driver D1
         wait;
      end process;
      process
      begin
         S(1 to 4)<="0011"; - - - driver D2
         wait;
      end process;
    end a;

EXAMPLE 1

In this example, driver D1 drives bits 3 and 4 of signal S, whereas driver D2 drives bits 1, 2, 3 and 4 of signal S. As a result, compile time driver analysis and runtime driver resolution are performed on a per-bit basis.

Figure 2:
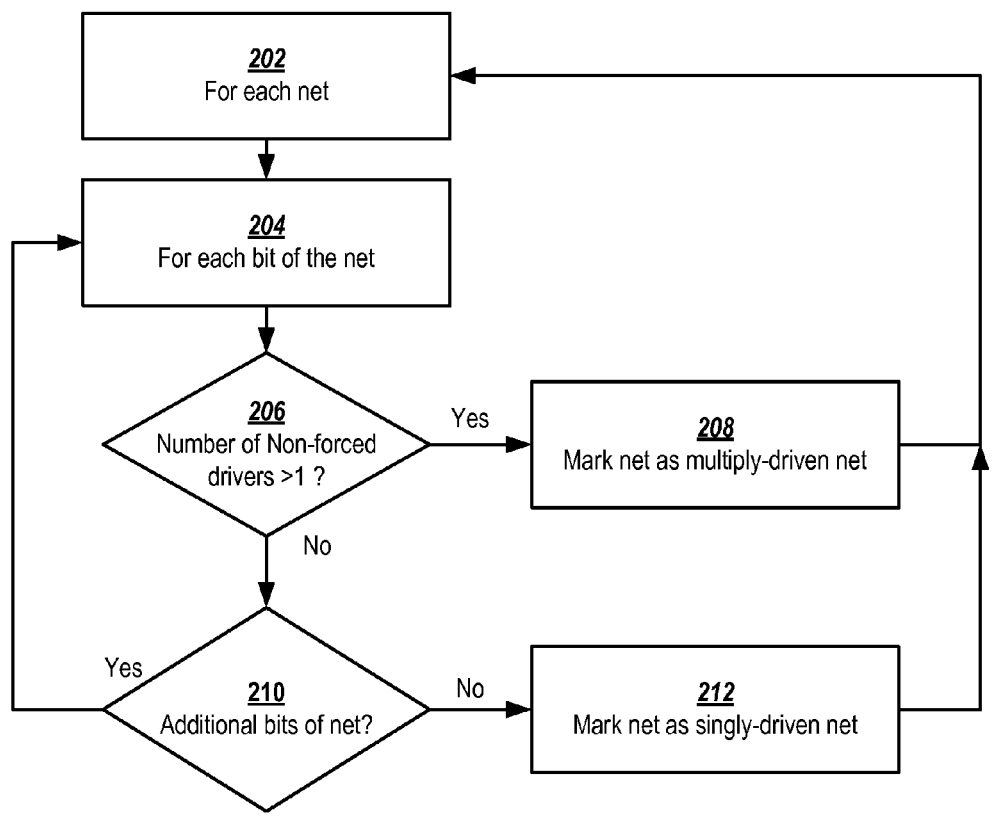
FIG. 2 shows a flowchart of a process for identifying singly-driven and multiply-driven nets in accordance with one or more embodiments.

FIG. 2 shows a flowchart of a process for identifying singly-driven and multiply-driven nets during HDL compilation in accordance with one or more embodiments. At block 202, for each net, bits of the net are sequentially checked at blocks 204, 206, and 210 to determine if a bit has more than one non-forced driver. If so, the net is identified as a multiply-driven net at block 208, and the process returns to block 202 to commence checking the next net. If all bits have been determined to have at most one non-forced driver at decision block 210, the net is identified as a singly-driven net at block 212 and the process is repeated for the next net at block 202.

For a mixed language design, language boundaries are traversed and driver information is collected for the mixed signal that corresponding to this net. When a net that crosses language boundaries is marked as multiply or singly driven, the corresponding mixed language signal is marked as well.

In one or more embodiments, the memory to be used at runtime for each net is determined during compilation in order to avoid the need for dynamically allocating the memory during the runtime phase. Multiply-driven nets are assigned contiguous blocks of memory during compilation to store values of various drivers of the nets. For a mixed language design, these contiguous blocks of memory include the driver information from both the VHDL and Verilog processes. The contiguous memory improves locality of memory locations used to store driver values needed to perform driver resolution. For example, when all driver values of a bit are stored in adjacent memory locations, the values can be more efficiently loaded into the cache memory at runtime, resulting in better cache performance.

Figure 3:
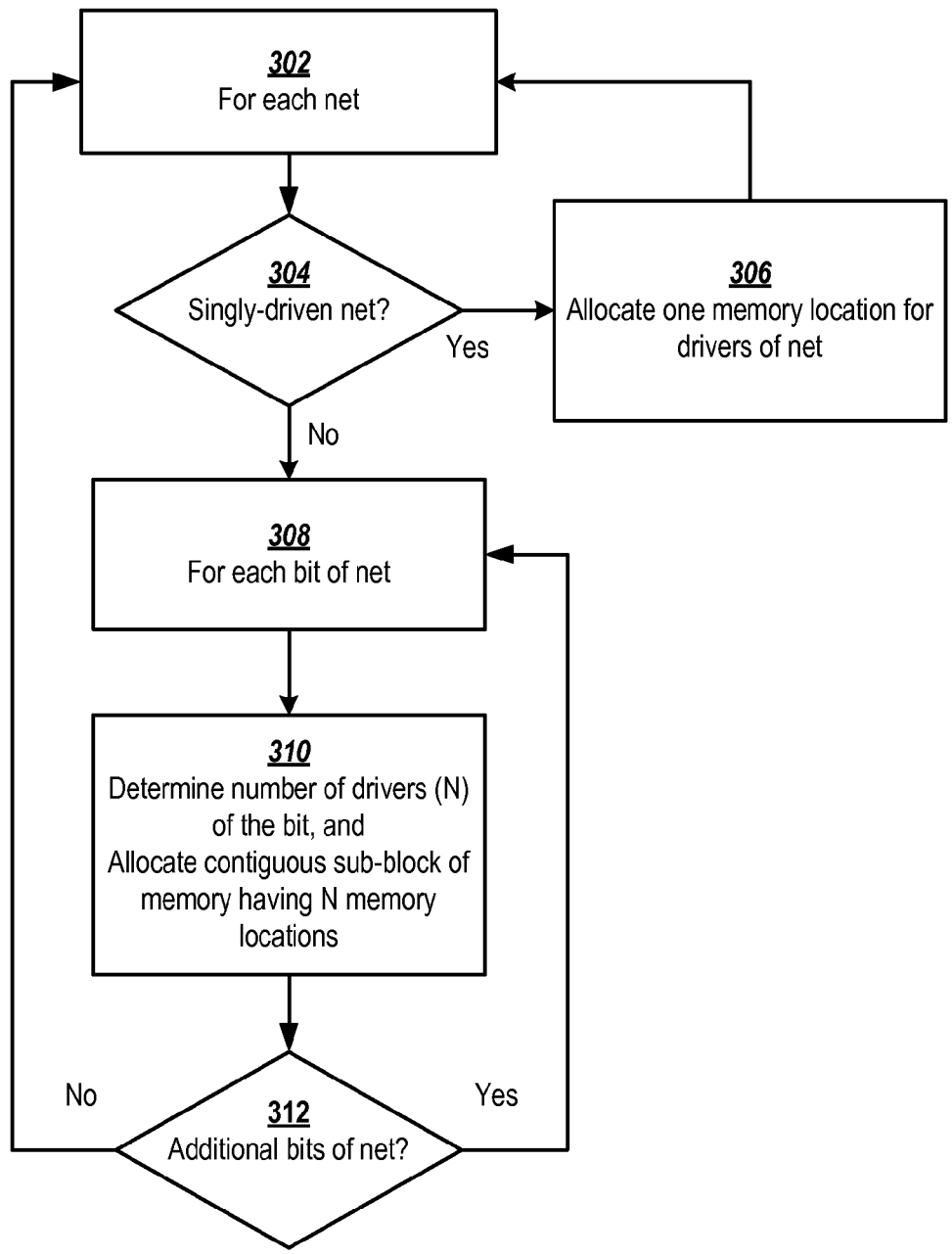
FIG. 3 shows a flowchart of a process for allocating contiguous memory blocks for the nets in accordance with one or more embodiments.

FIG. 3 shows a flowchart of a process for allocating contiguous memory blocks for nets during compilation in accordance with one or more embodiments. As discussed above, different simulation code is generated to handle singly-driven and multiply-driven nets. For each singly-driven net, a single memory location is assigned to store the value of the net at runtime at block 306. For each multiply-driven net, a static block of memory is assigned. The static block includes a sub-block of contiguous memory locations for the drivers of each bit of the net. Block 308 controls a process loop for allocating the sub-block of memory for each bit of the multiply-driven net. At block 310, a number of drivers (N) of the bit is determined, and a sub-block of memory having N contiguous memory locations is allocated for this bit. The process repeats until decision block 312 determines that a memory sub-block has been allocated for each bit of the net.

As described above, each simulation cycle performs updates to values of nets. Each update to a net may trigger a number of processes. Processes dependent on the updated nets are scheduled and executed in the delta cycle. Due to the analysis of drivers during compilation, runtime handling of nets is simplified. Whether a signal is singly-driven or multiply-driven, the code generated in the update function implements only two main actions: 1) update net values, and 2) schedule processes that are sensitive to changes in value of the net. For multiply-driven signals, the values of the drivers will also be computed during the execute phase of the simulation kernel, and the values of signals are updated according to these drivers' values. During the update phase, driver resolution has to take place for all the signals that need to be changed. The resolved value has to be assigned as the new value of the signal, and processes sensitive to this signal have to be scheduled for the next delta cycle.

Figure 4:
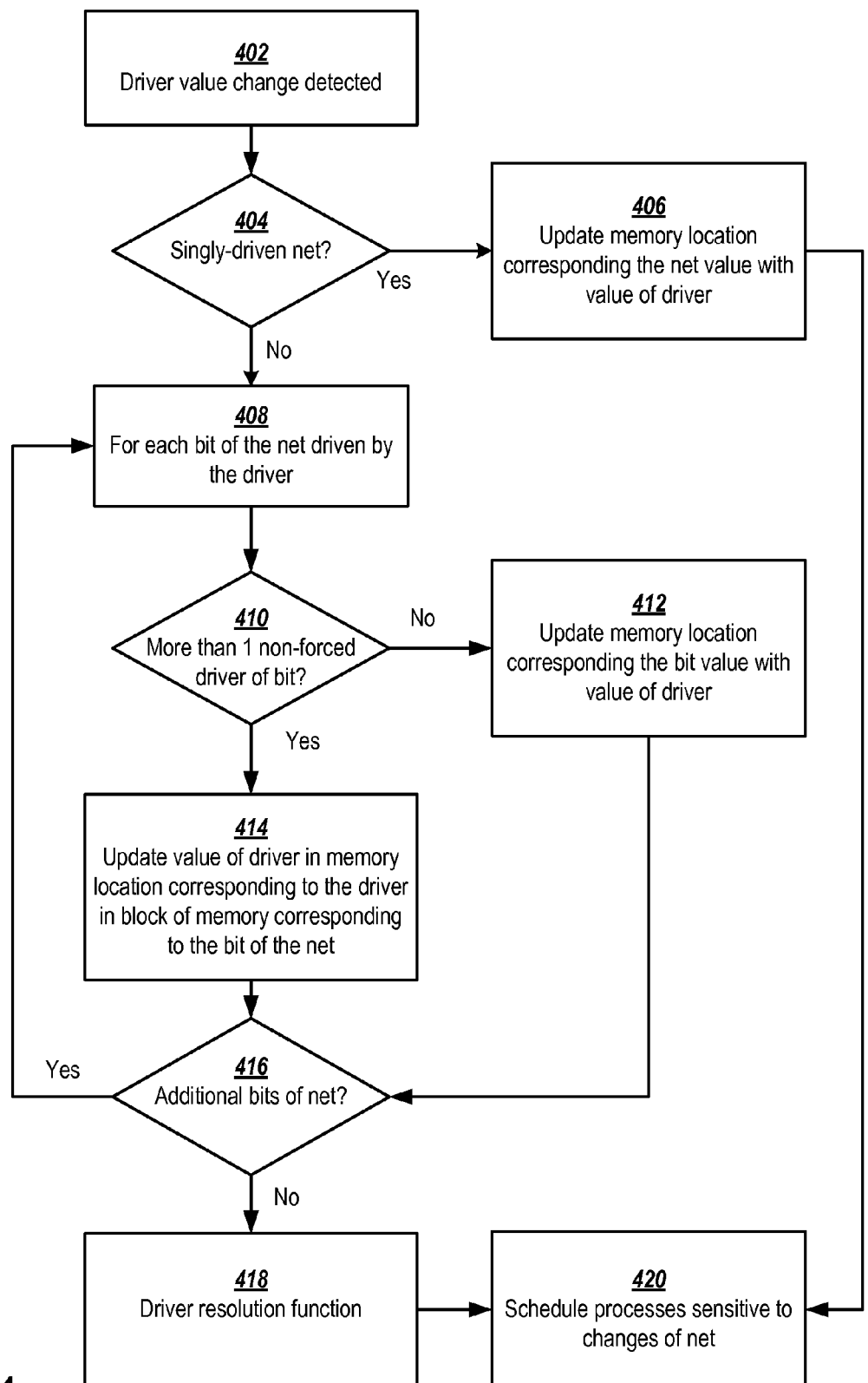
FIG. 4 shows a flowchart of a process for updating nets in response to changes in value of drivers in accordance with one or more embodiments.

FIG. 4 shows a flowchart of a process for updating nets in response to changes in the values of drivers in accordance with one or more embodiments. In response to detecting a change in the value of a driver of a net at block 402, the process determines if the net is singly-driven or multiply-driven at decision block 404. If the net is singly-driven, the memory location corresponding to the value of the net is updated with the value of the driver at block 406. If the net is multiply-driven, block 408 commences processing for each bit driven by the driver. If the driver is the only non-forced driver of the bit (decision block 410), a memory location corresponding to a value of the bit is updated with the value of the driver at block 412.

As described above, the values of bits having multiple drivers are determined by a resolution function based on the values of the drivers of the bit. If the bit is multiply-driven (i.e., has multiple non-forced drivers), a memory location corresponding to the driver is updated in a block of memory corresponding to the bit of the net at block 414. The processing of blocks 410, 412, and 414 is repeated until all bits of the net driven by the driver have been updated, as determined decision block 416.

After all driver/bit values have been updated for each bit at blocks 412 or 414, a driver resolution function is executed at block 418. The driver resolution function determines bit values for each of the multiply-driven bits based on the driver values updated at block 414. Once memory values have been updated at blocks 406, 412, or 418, processes sensitive to changes in the net are scheduled at block 420.

If the simulation is a mixed language simulation, conversion between driver value formats may be handled in a number of ways. In one implementation, driver values are stored to be compatible with the HDL language used to describe the top level module that uses the corresponding net. Conversion of driver values to other HDL language may then occur when lower level modules are scheduled.

Figure 5:
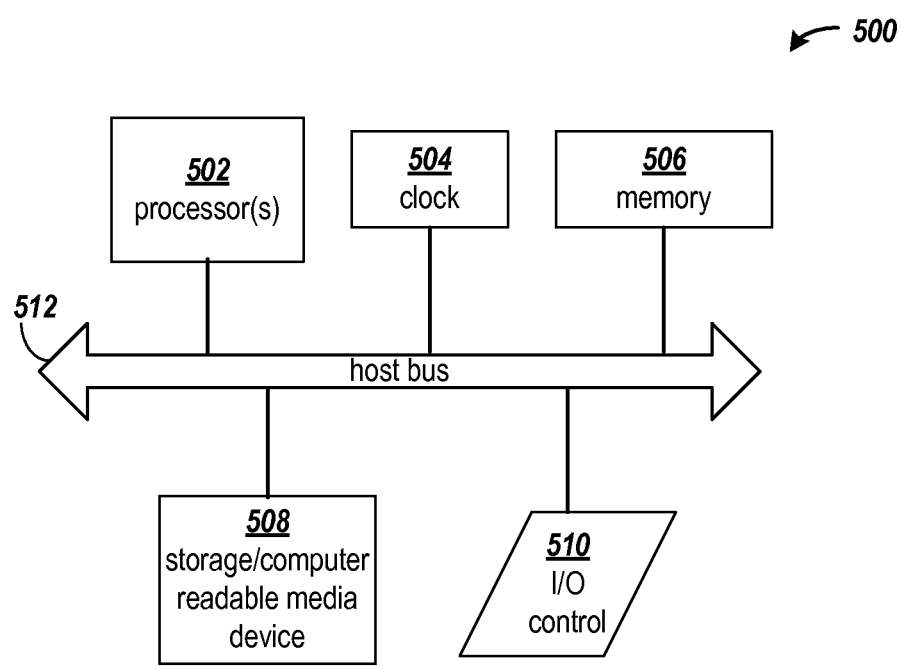
FIG. 5 shows a computing architecture that may be configured to perform the compilation and simulation processes.

FIG. 5 shows a block diagram of an example computing arrangement that may be configured to implement the compilation and/or simulation processes described herein. It will be appreciated that various alternative computing arrangements, including one or more processors and a memory arrangement configured with program code, would be suitable for hosting the processes and data structures and implementing the algorithms of the different embodiments. The computer code, comprising the processes of one or more embodiments encoded in a processor executable format, may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory unit 506, a storage unit 508, and an input/output control unit 510 coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements, as would be recognized by those skilled in the art. The processor 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage, such as provided by magnetic disks (not shown), flash, EPROM, or other non-volatile data storage. The storage unit may be read or read/write capable. Further, the memory 506 and storage 508 may be combined in a single arrangement.

The processor arrangement 502 executes the software in storage 508 and/or memory 506 arrangements, reads data from and stores data to the storage 508 and/or memory 506 arrangements, and communicates with external devices through the input/output control arrangement 510. These functions are synchronized by the clock signal generator 504. The resource of the computing arrangement may be managed by either an operating system (not shown), or a hardware control unit (not shown).

The embodiments may be applicable to a variety of systems for HDL simulation. Other aspects and embodiments will be apparent from consideration of the specification. It is intended that the specification and illustrated embodiments be considered as examples only, with a true scope of the embodiments being indicated by the following claims.

What is claimed is:

1. A method for compiling a hardware description language (HDL) specification for simulation of a circuit design, the method comprising using one or more processors to perform operations including:
   elaborating the circuit design from the HDL specification;
   determining singly-driven and multiply-driven nets of the elaborated circuit design;
   for each singly-driven net, assigning a respective memory location to store a value of a corresponding driver of the net at runtime;
   for each multiply-driven net, assigning a contiguous block of memory to store values of corresponding drivers of the net at runtime;
   generating simulation code that models the circuit design, the simulation code configured and arranged to, during runtime, for each singly-driven net, store a value of the corresponding driver of the singly-driven net in the respective memory location, and for each multiply-driven net, store the values of the corresponding drivers in the assigned block of memory; and
   storing the generated simulation code.

2. The method of claim 1, wherein, for each multiply-driven net, the assigned contiguous block of memory is of a size sufficient to store values of non-forced drivers of each bit of the net.

3. The method of claim 1, wherein determining singly-driven and multiply-driven nets of the elaborated circuit design includes:
   identifying non-forced drivers of each net;
   in response to a net having less than two non-forced drivers, storing data indicating the net is singly-driven; and
   in response to a net having two or more non-forced drivers:
      determining the number of drivers for each bit of the net; and
      in response to one of the bits of the net having multiple drivers, storing data indicating the net is multiply-driven.

4. The method of claim 1, wherein:
   the HDL specification includes at least one module described with a first HDL and at least one module described with a second HDL different from the first HDL; and
   the determining of singly-driven and multiply-driven nets of the elaborated circuit design includes collecting driver information for modules described in the first HDL and driver information for modules described in the second HDL.

5. The method of claim 4, wherein:
   the determining of singly-driven and multiply-driven nets of the elaborated circuit design further includes, in response to determining a net has signals of both the first and second HDLs as drivers, storing information indicating whether a corresponding mixed-language signal is singly-driven or multiply-driven.

6. The method of claim 1, wherein the generating of the simulation code includes generating simulation code that is configured and arranged to, in response to a change in a driver of a singly-driven net:
   update the memory location assigned to the singly-driven net with the value of the corresponding driver; and
   schedule processes sensitive to the singly-driven net.

7. The method of claim 1, wherein:
   for each multiply-driven net, the assigned contiguous block of memory includes a contiguous sub-block for each bit of the net, and each sub-block includes a memory location for each non-forced driver of the bit; and
   the generating of the simulation code includes generating simulation code that is configured and arranged to, in response to a change in a non-forced driver of a multiply-driven net in a simulation delta cycle, for each bit of the multiply-driven net driven by the non-forced driver:
      in response to the non-forced driver being an only non-forced driver of the bit:
         update the sub-block corresponding to the bit with the value of the non-forced driver; and
         schedule processes that are sensitive to the bit of the net; and
      in response to the non-forced driver not being the only non-forced driver of the bit:
         update the memory location that corresponds to the non-forced driver in the sub-block that corresponds to the bit of the net, with the value of the non-forced driver; and
      after all drivers scheduled for the simulation delta cycle have updated their values, call a resolution function that computes a value of the bit from the values of the non-forced drivers of the bit.

8. The method of claim 7, wherein the call to the resolution function passes a pointer to the contiguous sub-block of memory corresponding to the bit.

9. The method of claim 1, wherein:
   the HDL specification includes at least one module described with a first HDL and at least one module described with a second HDL different from the first HDL;
   a module of the HDL specification that is at a top hierarchical level is described in the first HDL; and
   the generating of the simulation code includes generating code that is configured and arranged to store data written to the assigned memory in a format compliant with the first HDL.

10. A method of simulating a circuit design using a compiled hardware description language (HDL) specification of the circuit design, the compiled HDL specification indicating a respective contiguous block of memory assigned to each net of the circuit design, the method comprising using one or more processors to perform operations including, in each simulation cycle:
   executing a set of scheduled processes of the compiled HDL specification;
   resolving values of the nets of the circuit design using the respective contiguous blocks of memory assigned to the nets;
   wherein resolving the value of a net is performed in response to a change in value of a driver of one of the nets; and in response to resolving a value of a net, scheduling processes of the compiled HDL specification that are dependent on the net for execution in a next simulation cycle.

11. The method of claim 10, wherein resolving the value of a net of the circuit design that is a singly-driven net includes:
storing a value of a driver of the singly-driven net to a memory location of the contiguous block of memory assigned to the net.

12. The method of claim 11, wherein the contiguous block of memory assigned to each singly-driven net includes an amount of memory sufficient to store only the value of the net.

13. The method of claim 11:
wherein the contiguous block of memory assigned to each multiply-driven net includes:
for each singly-driven bit, a memory location to store a value of the bit; and
for each multiply-driven bit:
a memory location to store a value of each driver of the bit including, for simulation of a mixed-language HDL specification described using both a first HDL and a second HDL, a respective value of each driver of the bit having a format compatible with the first HDL, and a respective value of each driver of the bit having a format compatible with the second HDL; and
a memory location to store a value of the bit; and
wherein the resolving of the value of a net of the circuit design that is multiply-driven includes, for each bit of the net driven by a driver having a changed value:
in response to the bit being singly-driven, updating a memory location of the contiguous block of memory corresponding to the bit with a value of the driver; and
in response to the bit being multiply-driven:
updating a memory location of the contiguous block of memory corresponding to the driver of the bit with a value of the driver;
determining a resolved value of the bit based on the values in the contiguous block of memory corresponding to drivers of the bit; and
storing the resolved value in a memory location of the contiguous block of memory corresponding to the value of the bit.

14. The method of claim 10, wherein:
the HDL specification includes at least one module described with a first HDL and at least one module described with a second HDL different from the first HDL;
the module of the HDL specification that is at a top hierarchical level is described in the first HDL;
the resolving the values of the nets of the circuit design includes converting drivers described in a format compatible with the second HDL to a format compatible with the first HDL; and
in response to resolving a value of a mixed-language net, the method further includes storing the resolved value in a format compatible with the first HDL.

15. An article of manufacture, comprising:
a non-transitory electronically readable medium having stored instructions that, when loaded into a processor, cause the processor to receive and compile a hardware description language (HDL) specification for simulation of a circuit design by performing steps including:
elaborating the circuit design from the HDL specification;
determining singly-driven and multiply-driven nets of the elaborated circuit design;
for each singly-driven net, assigning a respective memory location to store a value of a corresponding driver of the net at runtime;
for each multiply-driven net, assigning a contiguous block of memory to store values of corresponding drivers of the net at runtime;
generating simulation code that models the circuit design, the simulation code configured and arranged to, during runtime, for each singly-driven net store a value of the corresponding driver the singly-driven net in the respective memory location and for each multiply-driven net store the values of the corresponding drivers in the assigned block of memory; and
storing the generated simulation code.

16. The article of manufacture of claim 15, wherein:
for each multiply-driven net, the assigned contiguous block of memory includes a sub-block for each bit of the net, and each sub-block includes a memory location for each non-forced driver of the bit including, for a mixed language net, a respective memory location for each non-forced driver described in a first HDL and a respective memory location for each non-forced driver described in a second HDL; and
the generating of the simulation code includes generating simulation code that is configured and arranged to,
in response to a change in a non-forced driver of a multiply-driven net, for each bit of the multiply-driven net driven by the non-forced driver:
in response to the non-forced driver being an only non-forced driver of the bit:
update the sub-block corresponding to the bit with the value of the non-forced driver; and
schedule processes that are sensitive to the bit of the net; and
in response to the non-forced driver not being the only non-forced driver of the bit:
update the memory location that corresponds to the non-forced driver in the sub-block that corresponds to the bit of the net, with the value of the non-forced driver; and
call a resolution function that selects a value of the bit from the values of the non-forced drivers of the bit.

17. The article of manufacture of claim 16, wherein the generating of the simulation code includes generating simulation code that is configured and arranged to, in response to a change in a driver of a singly-driven net:
update the memory location assigned to the singly-driven net with the value of the corresponding driver; and
schedule processes sensitive to the singly-driven net.

18. The article of manufacture of claim 15, wherein determining singly-driven and multiply-driven nets of the elaborated circuit design includes:
identifying non-forced drivers of each net, the identifying including, for compilation of a mixed language design having at least one module described with a first HDL and at least one module described with a second HDL, identifying non-forced drivers of each net that are described in either the first HDL or the second HDL;
in response to a net having less than two non-forced drivers, storing data indicating the net is singly-driven; and
in response to a net having two or more non-forced drivers:
determining the number of drivers for each bit of the net; and in response to one of the bits of the net having multiple drivers, storing data indicating the net is multiply-driven.

19. The article of manufacture of claim 15, wherein:

the HDL specification includes at least one module described with a first HDL and at least one module described with a second HDL different from the first HDL;

a module of the HDL specification that is at a top hierarchical level is described in the first HDL; and the generating of the simulation code includes generating code that is configured and arranged to store data written to the assigned memory for drivers in a format compliant with the first HDL.

* * * * *